(12) United States Patent
Nguyen et al.

(10) Patent No.: US 6,972,994 B2
(45) Date of Patent: Dec. 6, 2005

(54) CIRCUIT AND A METHOD TO SCREEN FOR DEFECTS IN AN ADDRESSABLE LINE IN A NON-VOLATILE MEMORY

(75) Inventors: Hung Q. Nguyen, Fremont, CA (US); Steve Choi, Irvine, CA (US); Loc Hoang, San Jose, CA (US); Alexander Kotov, Sunnyvale, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 66 days.

(21) Appl. No.: 10/797,156

(22) Filed: Mar. 9, 2004

(65) Prior Publication Data

US 2005/0201152 A1      Sep. 15, 2005

(51) Int. Cl.[7] .......................... G11C 16/06; G11C 29/00
(52) U.S. Cl. .................. 365/185.09; 365/200
(58) Field of Search ...................... 365/185.09, 185.21, 365/200

(56) References Cited

U.S. PATENT DOCUMENTS

| 4,636,988 | A | * | 1/1987 | Tran ........................... 365/200 |
|---|---|---|---|---|
| 5,029,130 | A | | 7/1991 | Yeh |
| 5,305,261 | A | * | 4/1994 | Furutani et al. ............. 365/200 |
| 5,321,655 | A | * | 6/1994 | Iwahashi et al. ........ 365/185.09 |
| 6,278,642 | B1 | * | 8/2001 | Lakhani et al. ............. 365/200 |
| 6,434,065 | B1 | * | 8/2002 | Kobayashi et al. ......... 365/200 |

* cited by examiner

*Primary Examiner*—Trong Phan
(74) *Attorney, Agent, or Firm*—Ronald L. Yin; DLA Piper Rudnick Gray Cary

(57) ABSTRACT

A circuit to screen for defects in an addressable line in a non-volatile memory array comprises a current mirror circuit which has a plurality of mirroring stages. The current mirror circuit is connected to the addressable line and receives a control signal and mirrors the control signal to provide a current to the addressable line. In a preferred embodiment, the current mirror circuit provides a high voltage current to the addressable line which is used to effectuate an operation such as program or erase to the memory cells connected to the addressable line. The change in state or the absence of change in state of the memory cells connected to the addressable line can be used to screen for defects in the addressable line.

9 Claims, 2 Drawing Sheets

US 6,972,994 B2

CIRCUIT AND A METHOD TO SCREEN FOR DEFECTS IN AN ADDRESSABLE LINE IN A NON-VOLATILE MEMORY

TECHNICAL FIELD

The present invention relates to a circuit and a method to screen for defects in an addressable line in a non-volatile memory.

BACKGROUND OF THE INVENTION

Non-volatile semiconductive memory cells are typically arranged in an array comprising of rows and columns. The rows and columns of memory cells are addressed by a plurality of addressable lines such as word lines, bitlines, source lines and drain lines. As used herein and in the claims, the term "addressable line" means any of the foregoing wherein a line accessing one or more memory cells electrically connected to the line can be addressed. Because the memory cells that are connected to an addressable line must be accessible or addressable during this operation, it is critical that after a memory device is manufactured that it be tested to ensure that there are no defects on an addressable line. Furthermore, in some particular memory cell arrays, such as that disclosed in U.S. Pat. No. 5,029,130, whose disclosure is incorporated herein by reference in its entirety, an addressable line such as a word line may require a high voltage to be supplied thereon to cause either an erase or a programming operation. In such event, even if the defect on the addressable line is not a total defect, i.e., an open circuit, a defect still exists if the required voltage is not high enough to perform the requisite operation.

Thus, there is a need to devise a method to screen the addressable line for defects.

SUMMARY OF THE INVENTION

In the present invention, a circuit to screen for defects in an addressable line in a non-volatile memory array comprises a current mirror circuit connected to the addressable line. The current mirror circuit has a plurality of mirroring stages. The current mirror circuit receives a control signal and mirrors the control signal to provide a current to the addressable line. The current on the addressable line is used to screen for defects.

DETAILED DESCRIPTION OF THE PREFERRED EMBODIMENTS

Figure 1:
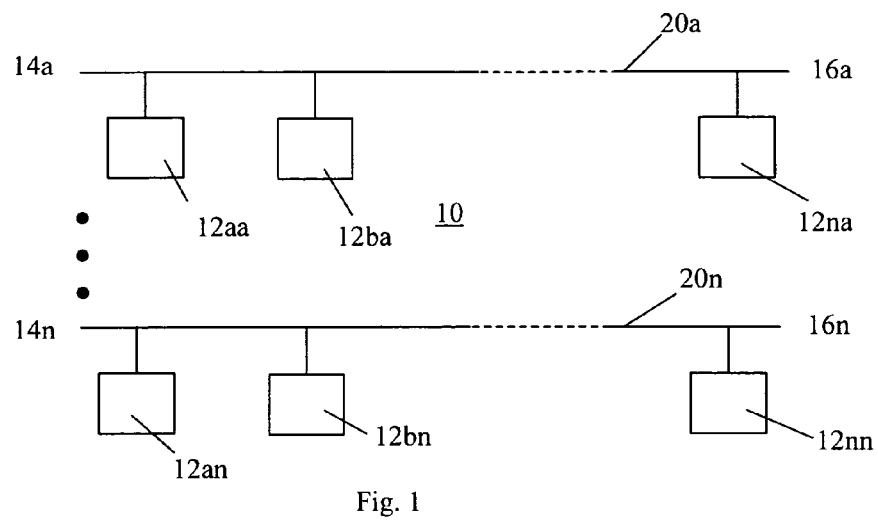
FIG. 1 is a block level schematic view of an array of non-volatile memory cells connected to a plurality of addressable lines which are screened by the circuit and method of the present invention for defects.

The present invention is a circuit 30 for use to screen or to test defects in addressable lines in a non-volatile memory array 10. Referring to FIG. 1, there is shown an example of a non-volatile memory array 10 to which the circuit 30 and the method of the present invention may be used. The non-volatile memory array 10 comprises a plurality of addressable lines 20(a . . . n). Each of the addressable lines 20 has a first end 14a and a second end 16a and extends from one end of the array 10 to the other end of the array 10. A plurality of non-volatile memory cells 12(aa . . . 12na) is attached to each addressable line 20a. A plurality of addressable lines 20(a . . . n) is shown in the array 10. As previously discussed, the circuit 30 and the method of the present invention may be used to detect or to screen for defects in each of the addressable lines 20. Each addressable line 20 can be a word line, a source line, drain line, bitline, select gate line, etc. In the preferred embodiment, each of the memory cells 12 is of a non-volatile memory cell and preferably of the type using floating gate for storage, and is connected to each addressable line 20. A high voltage is applied to the addressable line 20 to effectuate either the operation of erase or program to the memory cells 12 connected thereto. Because a high voltage is applied to the addressable line 20, it is desired to detect defects in the addressable line 20. The circuit 30 and the method of the present invention can accomplish this goal. As used herein, the term defect is not necessarily limited to an open circuit condition. Rather, because a high voltage must be applied to the addressable line 20 to effectuate either an operation of erase or program, any type of defect, including but not limited to reduction in the current carrying capacity or high resistance on the addressable line 20, is deemed a defect and it is desired to be detected before the memory cell array 20 is packaged and sold.

Figure 2:
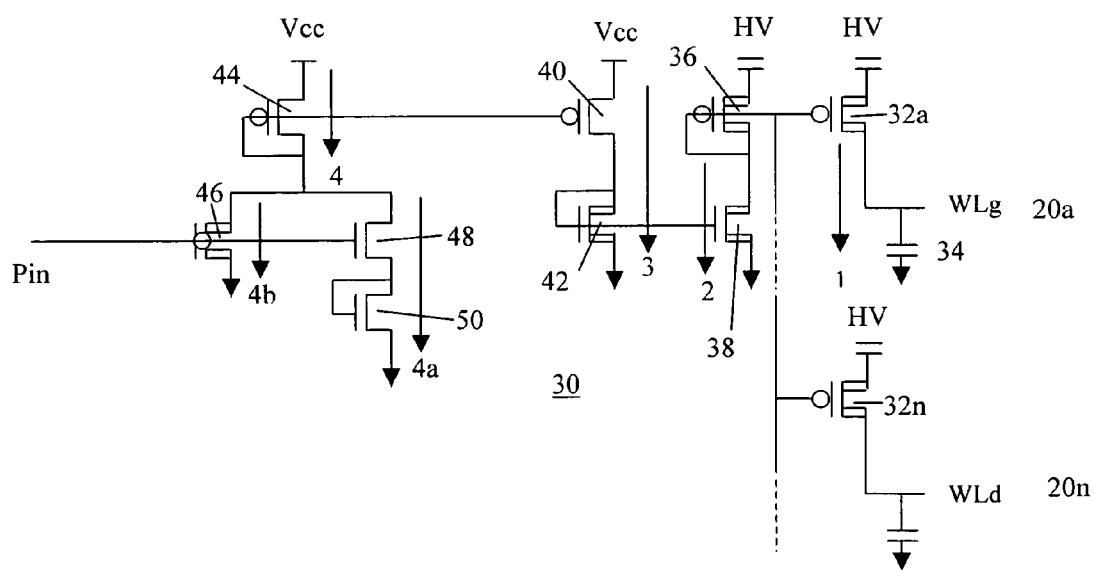
FIG. 2 is a detailed circuit diagram of the circuit of the present invention to screen for defects in an addressable line in the non-volatile memory array shown in FIG. 1.

Referring to FIG. 2, there is shown a circuit diagram of the detection circuit 30 of the present invention. The circuit 30 is a current mirror circuit comprising of a plurality of mirroring stages (1–4). Each of the current mirror stages (1–4) mirrors the current that is supplied in the other stages. Thus, the first current mirror stage 1 is connected to each of the word lines or addressable lines 20 to which the circuit 30 of the present invention is connected to detect defects therein.

The current mirror circuit stage 1 comprises a first P-channel high voltage transistor 32. The first P-channel high voltage transistor 32 has a first terminal connected to a source of high voltage, HV, and a second terminal connected to the addressable line 20a . . . n. Current flows from the high voltage source HV through the first P-channel high voltage transistor 32 to the word line 20 and through the capacitor 34. The capacitor 34 is simply a schematic representation of the capacitance of the non-volatile memory cells connected to the word line 20.

The current flowing through this current mirror stage 1 is mirrored at current mirror stage 2. The current mirror stage 2 comprises a second P-channel high voltage transistor 36 whose first terminal is also connected to the high voltage source HV. The gate of the second P-channel high voltage transistor 36 is connected to the gate of the first P-channel high voltage transistor 32. In addition, the gate of the second P-channel high voltage transistor 36 is connected to the second terminal which is connected to the first terminal of a first N-channel high voltage transistor 38. The second terminal of the first N-channel high voltage transistor 38 is connected to ground, thereby forming the current path for the second stage current mirror 2.

The current flowing through the second stage current mirror 2 is also mirrored in the third current mirror stage 3. The third current mirror stage 3 comprises a first P-channel low voltage transistor 40 whose first terminal is connected to Vcc or low voltage. The second terminal of the first P-channel low voltage transistor 40 is connected to the first terminal of the second high voltage N-channel transistor 42 at its first terminal and to its gate. The gate of the second N-channel high voltage transistor 42 is connected to the gate of the first N-channel high voltage transistor 38. The second terminal of the second N-channel high voltage transistor 42 is connected to ground. The current flowing from Vcc to ground through the transistors 40 and 42 forms the third current mirror stage 3.

The current flowing through the third mirror stage 3 is mirrored at the fourth current mirror stage 4. The fourth current mirror stage 4 comprises a second P-channel low voltage transistor 44 whose first terminal is connected to Vcc and whose second terminal is connected to the gate of the transistor 44 and to the gate of the transistor 40. The current flowing through the transistor 44 is then connected to a node which is connected to two paths. In a first current path 4b, the current flows through a third P-channel low voltage transistor 46 with native or low threshold voltage, and then to ground. The second current path 4a from the node is supplied to a first N-channel low voltage transistor 48 whose first terminal is connected to the node and whose gate is connected to the gate of the third P-channel low voltage transistor 46. The second terminal of the first N-channel low voltage transistor 48 is connected to a second N-channel low voltage transistor 50 at its first terminal and to its gate. The second terminal of the second N-channel low voltage transistor 50 is connected to ground. The second N-channel low voltage transistor 50 having its gate connected to its first terminal is connected in a diode configuration. Preferably, the transistor 46 is of a weaker transistor than transistors 48 and 50. As is well known, based upon current law, current 4 that passes through transistor 44 is equal to the current flow 4a plus 4b.

Figure 3:
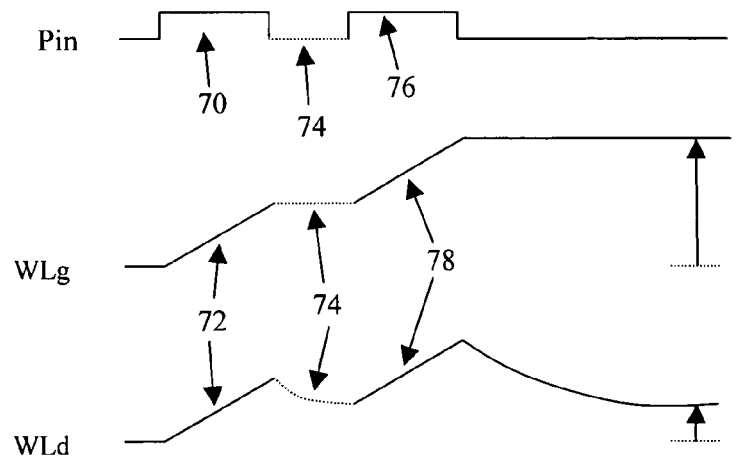
FIG. 3 is a graph showing voltage versus time of the control signal applied to the input of the current mirror circuit of the present invention and the voltage that results on an addressable line which is good or which has a defect.

Referring to FIG. 3, there is shown a graph of voltage versus time of the control signal applied to the external pin and the voltage versus time as it is applied to two addressable lines 20(a and n): WLg (addressable line 20a which is good) and WLg (addressable line 20n which is defective). Initially, if the control signal Pin applied to the external pin is of a pulse 70, both the good word line 20a and the defective word line 20n would show an increase in voltage 72. After the pulse 70 has been applied, and a period 74 of ground is applied, the voltage on the good word line 20a would remain at the peak at which its voltage had risen. However, the voltage on the defective word line 20n would begin to decay. When another voltage pulse 76 is applied on the external pin, the voltage on the good word line 20a would again rise. The voltage 78 on the defective word line 20n, however, would also rise but from a lower level. Therefore, the end voltage difference between the good word line 20a and the defective word line 20n would differ as shown by the right-hand side of the graph shown in FIG. 3. This condition can be detected by one of two methods.

In a first method, the current mirror circuit 30 can be used to apply the voltage to one end 14 of each of the addressable lines 20. A probe is attached to the other end 16 of each of the addressable lines 20 and the voltage at the other end 16 is detected and that would be determinative of whether the addressable line 20 is good or is defective.

In a second method of the present invention, the voltage on the various addressable lines 20 is used to effectuate an operation to the memory cells 12 that are electrically connected to the addressable line 20. For example, as disclosed in U.S. Pat. No. 5,029,130, a high voltage is applied to the word line to cause an erase of the floating gate of the memory cells 12 attached to the word line 20. Thus, initially, all of the memory cells 12 that are connected to the addressable line 20 in question would be first programmed. Subsequently, the method of the present invention would be used to cause a high voltage to be supplied to the addressable line 20. If the memory cells 12 electrically connected to the addressable line 20 that is being tested fails to be erased, then that is indicative of a defect on the addressable line 20. The condition of whether the memory cell 12 is erased or not can be determined by reading out each of the memory cells 12 connected to the addressable line 20 which is undergoing testing.

Figure 4A:
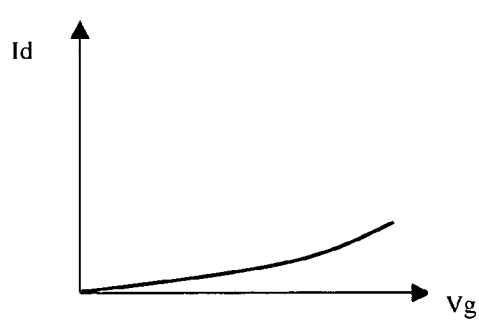
FIG. 4A is a graph of current versus voltage for transistor 46 which is part of the current mirror circuit of the present invention.

Referring to FIG. 4A, there is shown a voltage versus current graph for the transistor 46 used in the current mirror circuit 30 of the present invention. As previously discussed, the transistor 46 is a P-type with a native or low threshold voltage and being weaker than transistor 48 and 50. By "weaker" it is meant that transistor 46 has a lower current carrying capacity than either transistors 48 or 50. In short, its width to length ratio of its channel region is smaller than the width to length ratio of the channel region for transistors 48 and 50. As can be seen in FIG. 4A, the transistor 46 exhibits a slow and weak conduction capability.

Figure 4B:
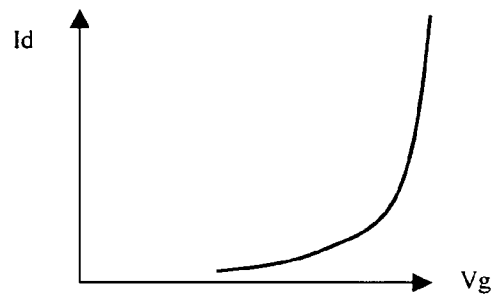
FIG. 4B is a graph of current versus voltage for transistors 48 and 50 which are part of the current mirror circuit of the present invention.
Figure 4C:
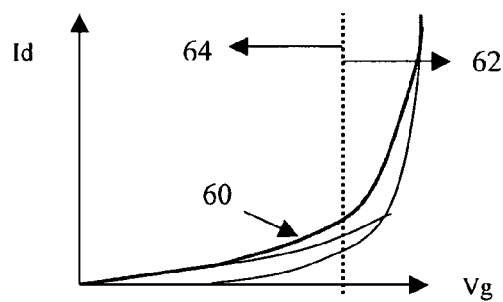
FIG. 4C is a graph of current versus voltage for transistor 46 connected in parallel with the transistors 48 and 50 which is part of the current mirror circuit of the present invention.

Referring to FIG. 4B, there is shown a voltage versus current graph of transistor 48. Transistor 48 is a stronger transistor than transistor 46 and has a higher threshold voltage than transistor 46. As a result, transistor 46 requires a greater gate voltage, Vg, to turn on. Further, once turned on, it carries a greater amount of current than transistor 46. The result of connecting transistor 46 in parallel with the serially connected transistors 48 and 50 is shown in FIG. 4C. The current/voltage characteristics of the circuit comprising of transistor 46 connected in parallel to the serially connected transistors 48 and 50 is a graph 60 shown in FIG. 4C. The graph 60 has two regions of operation: a first region 64 and a second region 62. The first region 64 may be deemed a "fine tuned" region since it takes a greater amount of voltage increase before current will begin to slowly rise. In contrast, the second region 62 may be deemed an "accelerated region". As can be seen in FIG. 4C, a relatively small increase in the gate voltage Vg causes a large current output in the accelerated region 62.

The advantage of using the transistors 46, 48 and 50 connected in the manner shown in FIG. 2 is that the circuit 30 of the present invention permits a fine-tuned method to determine defects in the addressable line 20. One can use a large gate voltage Vg, which is the control signal supplied from the external pin, to quickly test and read all the addressable lines 20. If all of the cells 12 in the entire array 10 have been erased, the method may be stopped. However, if a defect is detected and at least one cell 12 is not erased, then one can perform the method of the present invention again using the fine-tuned region 64 to slowly input voltage Vg into the sector of cells that is of interest to determine the particular addressable line 20 that is defective. Alternatively, the fine-tuned region 64 can also be used to detect process deviation during the manufacturing of the array 10. Thus, the circuit 30 of the present invention affords a greater degree of flexibility in determining defects in the addressable lines 20 of the array 10.

What is claimed is:

1. A circuit to screen for defects in an addressable line in a non-volatile memory array, said circuit comprising:
   a current mirror circuit connected to the addressable line and having a plurality of mirroring stages; said current mirror circuit for receiving a control signal, and mirroring said control signal to provide a current to said addressable line;
   wherein said current on said addressable line is used to screen for defects.

2. The circuit of claim 1 wherein one of said plurality of mirroring stages is connected to said addressable line and to a source of high voltage.

3. The circuit of claim 2 wherein one of said plurality of mirroring stages for receiving the control signal comprises:
   a first MOS transistor having a first threshold voltage;
   a second MOS transistor having a second threshold voltage;
   wherein said first and second MOS transistors are connected in parallel with the gate of said first and second MOS transistors connected together for receiving the control signal;
   wherein said first threshold voltage is lower than said second threshold voltage; and
   wherein said first MOS transistor is a weaker transistor than said second MOS transistor.

4. The circuit of claim 3 wherein said second MOS transistor is connected in series to a diode connected NMOS transistor.

5. A method of screening for defects in an addressable line in a non-volatile memory array, said method comprising:
   supplying a control signal to a current mirror circuit connected to the addressable line;
   mirroring said control signal by the current mirror circuit to provide a current to the addressable line;
   using said current to screen for defects on said addressable line.

6. The method of claim 5 wherein said current mirror circuit supplies a current from a high voltage source to the addressable line.

7. The method of claim 6 wherein said addressable line has a length having a first end and a second end, and wherein said current is supplied substantially near the first end, and wherein the using step comprises:
   measuring for current flow substantially near the second end, wherein the current flow measured is indicative of potential defects on the addressable line.

8. The method of claim 6 wherein said addressable line has a plurality of non-volatile memory cells electrically connected thereto, and wherein the current from the current mirror circuit can change the state of the cells; and wherein the using step comprises:
   reading the state or the memory cells connected to the addressable line to determine if the state of the cells were changed.

9. The method of claim 6 wherein said addressable line is a word line.

* * * * *